United States Patent
Bhardwaj et al.

(10) Patent No.: US 12,189,135 B2
(45) Date of Patent: Jan. 7, 2025

(54) INJECTION LOCKED HIGH-POWER LOW-NOISE INTEGRATED LASER ARRAY

(71) Applicant: Infinera Corporation, San Jose, CA (US)

(72) Inventors: Ashish Bhardwaj, Fremont, CA (US); Gloria E. Hoefler, San Jose, CA (US)

(73) Assignee: Infinera Corporation, San Jose, CA (US)

( * ) Notice: Subject to any disclaimer, the term of this patent is extended or adjusted under 35 U.S.C. 154(b) by 665 days.

(21) Appl. No.: 17/221,585

(22) Filed: Apr. 2, 2021

(65) Prior Publication Data

US 2022/0057641 A1    Feb. 24, 2022

Related U.S. Application Data

(60) Provisional application No. 63/003,990, filed on Apr. 2, 2020.

(51) Int. Cl.
| | |
|---|---|
| *H01S 5/026* | (2006.01) |
| *G02B 27/10* | (2006.01) |
| *H01S 5/12* | (2021.01) |
| *H01S 5/125* | (2006.01) |
| *H01S 5/40* | (2006.01) |

(52) U.S. Cl.
CPC ............ *G02B 27/10* (2013.01); *H01S 5/0264* (2013.01); *H01S 5/1246* (2013.01); *H01S 5/125* (2013.01); *H01S 5/4012* (2013.01)

(58) Field of Classification Search
CPC ....... G02B 27/10; G02B 26/06; H01S 5/0264; H01S 5/1246; H01S 5/125; H01S 5/4012; G01S 7/4814
See application file for complete search history.

(56) References Cited

U.S. PATENT DOCUMENTS

| | | | |
|---|---|---|---|
| 2004/0101317 A1* | 5/2004 | Yap | H01S 5/4006 398/187 |
| 2017/0110850 A1* | 4/2017 | Li | H01S 5/0268 |
| 2019/0199057 A1* | 6/2019 | Wen | H01S 5/021 |
| 2021/0063776 A1* | 3/2021 | Larson | H01S 5/50 |

* cited by examiner

*Primary Examiner* — Yuanda Zhang

(57) ABSTRACT

Consistent with the present disclosure, an output of a seed laser is split by a series of first coupler stages and each split portion is provided to a respective laser in an array of secondary lasers to realized injection locking of the laser array. Undesired light output from the secondary laser array back to the seed laser is monitored and the phase of such light is adjusted so that such light is subject to destructive interference and its power is minimized. Accordingly, light output from the secondary laser array back to the seed laser does not degrade the performance of the seed laser. On the other hand, light intended for output from the secondary laser array is combined through a second series of coupler stages and monitored at each stage. The phase of the output of each laser in the array is controlled to equal or be aligned with one another such that laser array outputs constructively interfere with one another. As a result, the combined output power is maximized.

15 Claims, 10 Drawing Sheets

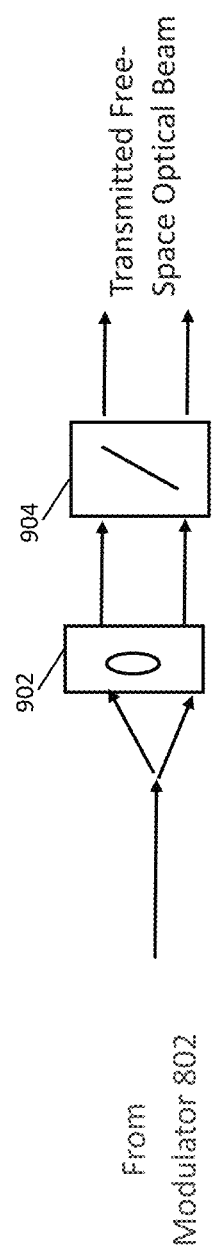

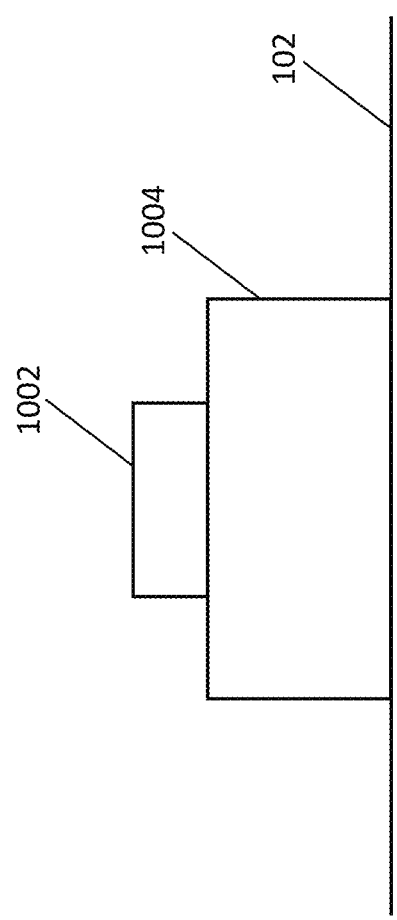

INJECTION LOCKED HIGH-POWER LOW-NOISE INTEGRATED LASER ARRAY

This application claims the benefit of U.S. Provisional Patent Application No. 63/003,990, filed Apr. 2, 2020, which is incorporated herein by reference in its entirety.

BACKGROUND

High optical output power lasers (radiance) are utilized in a variety of scientific and industrial applications, including material processing, medical research, and particle acceleration. Typically, the laser characteristics of importance are output power and beam quality. One way to achieve high radiance while circumventing thermal and non-linear processes generated by increased optical power in the gain media, is to combine laser beams from multiple lower radiance elements. This can be achieved by combining laser beams or outputs of different spectral signatures (spectral beam combining) or by combining laser beams with two orthogonal polarization states (polarization beam combining). Although these methods are useful in a variety of applications, they degrade the spectral and polarization purity of the resulting output. Coherent beam combining techniques where the spectral and polarization characteristics of the output beam are faithful reproductions of each of the input beams may produce low-noise, narrow linewidth lasers for applications in sensing, microwave and optical communications, for example.

Injection locking provides a path for lasers with low relative intensity noise (RIN) and narrow linewidth. A characteristic of coherent beam combining is that the aggregated laser will have a lower RIN compared to an individual laser. This is explained by noting that in a system with N array elements, the coherently combined power of the injection-locked array is increased by 2×N, whereas the incoherent noise adds proportional to N, thus improving the signal to noise ratio (SNR) by a factor of 2/N=N. As a result, the RIN is reduced by a factor of N.

Mutual injection locking to demonstrate high-power solid-state laser arrays has been proposed where a master oscillator laser injection locks an array on N-slave oscillator lasers to generate an injection locked output. In this architecture, bidirectional (mutual) injection locking is achieved using discrete, solid-state lasers. Each laser element shares part of its output with other elements in bidirectional locking, The mutual injection locking between the array of lasers requires mutual coupling between the secondary lasers in the array, which is difficult to stabilized as the number of lasers in the array is increased making, such that the architecture may be prone to long-term frequency drifts and instabilities. This architecture also requires discrete optical isolators between the seed laser and the secondary lasers in the array.

Coherent beam combining has also been demonstrated using an array of integrated slab coupled optical waveguide amplifiers. Such beam combining achieved an output power of 40 W from a single diffraction-limited beam using a one-dimensional 47-element array of angled-facet slab-coupled optical waveguide amplifiers at a wavelength of 1064 nm with active phase-locking. This demonstration was achieved using bulk components rather than using monolithic integration. This approach is similar to unidirectional injection locking but the coherent combined beam has degraded linewidth and noise properties resulting from the amplified spontaneous emission (ASE) of the optical amplifiers which add incoherently. The external optical isolator is used to prevent degradation of the spectral properties of the reference oscillator from reflections as well as backwards propagating ASE from the optical amplifiers. However, such optical isolators are difficult to translate to a monolithically integrated chip-scale solution.

Similarly, a there has been demonstration of a coherently combined array of Yb-doped fiber amplifiers to generate a 1.93 kW beam. Here, bulky external diffractive optical elements (DOE) were deployed. While fiber amplifiers have better noise properties compared to semiconductor optical amplifiers, the fiber amplifier based system is not integrable to provide a chip-scale solution with a small form-factor.

SUMMARY

Consistent with an aspect of the present disclosure, an apparatus is provided that include a first laser having a first side and a second side, the first laser being operable to output a first optical signal from the first side and a second optical signal from the second side. In addition, the apparatus includes a second laser having a first side and a second side, the second laser being operable to supply a third optical signal from the first side of the second laser, and the second laser being operable to supply a fourth optical signal from the second side of the second laser, power levels associated with the first and third optical signals being greater than power levels associated with the second and fourth optical signals. Further, the apparatus includes a first phase shifter operable to receive and adjust a phase of the first optical signal, and a second phase shifter operable to receive and adjust a phase of the second optical signal. Further, the apparatus includes a third phase shifter operable to receive and adjust a phase of the third optical signal, and a fourth phase shifter operable to receive and adjust a phase of the fourth optical signal. Moreover, a first coupler is provided that is operable to receive the first phase adjusted signal and the third phase adjusted optical signal, whereby the first and second phase adjusted optical signals combine with constructive interference in the optical coupler to provide a combined optical output. In addition, a second coupler is provided that is operable to receive the second phase adjusted optical signal and the fourth phase adjusted optical signal, whereby the second phase adjusted optical signal and the fourth phase adjusted optical signal combine with destructive interference in the second optical coupler.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) and together with the description, serve to explain the principles of the invention.

BRIEF DESCRIPTION OF THE DRAWINGS

FIG. 9 shows a portion of a free space transmission system consistent with the present disclosure; and FIG. 10 shows an example of a phase shifter consistent with an additional aspect of the present disclosure.

DESCRIPTION OF THE EMBODIMENTS

Figure 1:
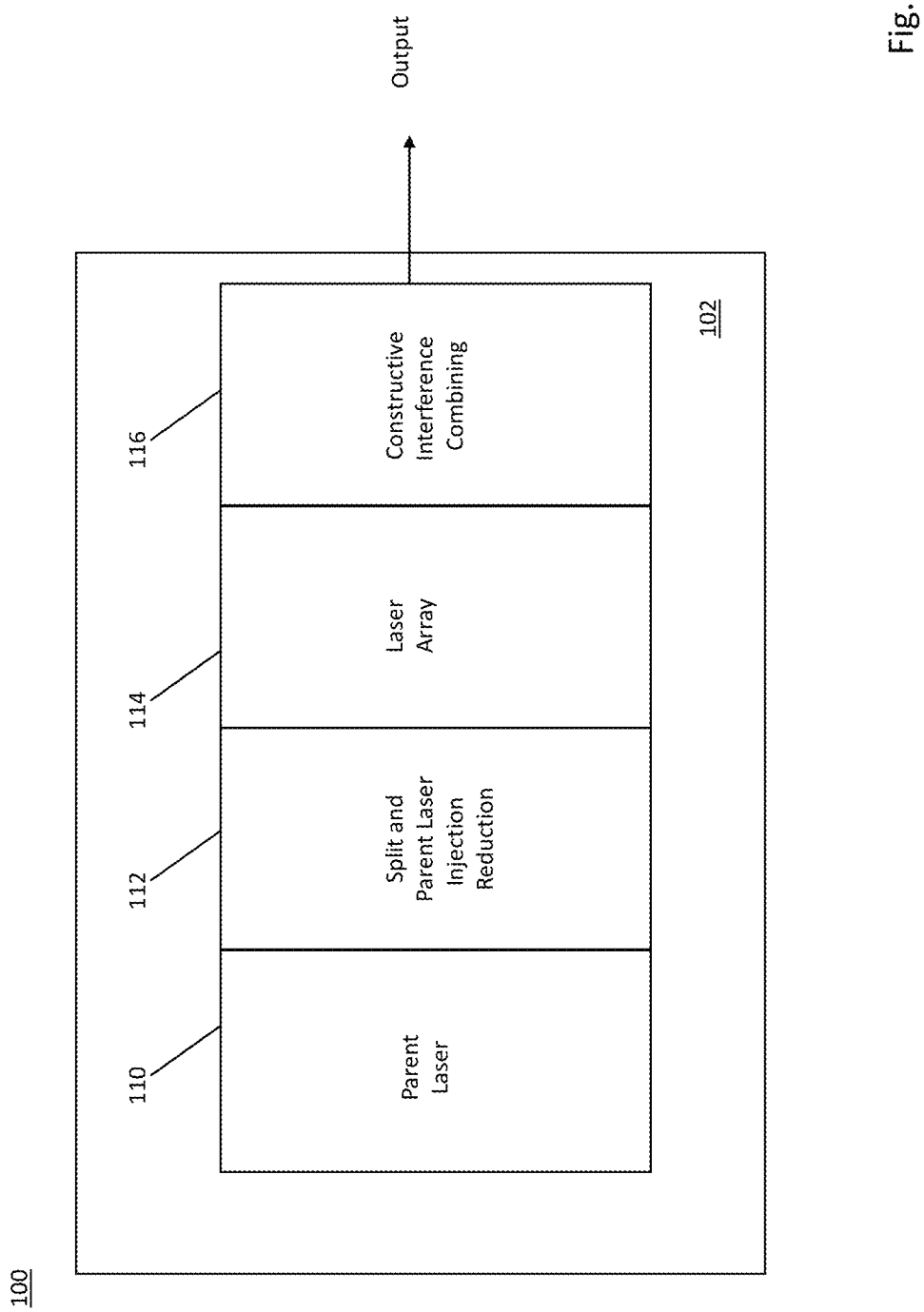
FIG. 1 illustrates an optical source consistent with the present disclosure.

Consistent with the present disclosure, an output of a seed laser is split by a series of first coupler stages and each split portion is provided to a respective laser in an array of secondary lasers to realized injection locking of the laser array. Undesired light output from the secondary laser array back to the seed laser is monitored and the phase of such light is adjusted so that such light is subject to destructive interference and its power is minimized. Accordingly, light output from the secondary laser array back to the seed laser does not degrade the performance of the seed laser. On the other hand, light intended for output from the secondary laser array is combined through a second series of coupler stages and monitored at each stage. The phase of the output of each laser in the array is controlled to equal or be aligned with one another such that laser array outputs constructively interfere with one another. As a result, the combined output power is maximized.

Preferably, the seed laser, couplers stages, and laser array are monolithically integrated to provide a Watt-class low-noise optical source based on the injection locking scheme. In one example, a mutually injected seed and reference oscillator laser are used to injection lock the array of secondary lasers and subsequently combine the array's optical output coherently to, in one example, aggregate power in excess of 1 W of optical power. The benefit of the injection locked approach is that the array of secondary lasers inherits the high-quality performance of the seed laser and simultaneously lase at the same wavelength as the seed laser as well as with each other. Integrating more lasers in the array along with DC-bias phase shifters and optical power monitors, enable scaling in power without significantly increasing control complexity to obtain coherent combining.

In one example, the primary or seed laser is passed through an optical isolator and injected into the secondary laser. In this case, the output of the secondary seed laser acquires the output characteristics of the input primary seed laser, e.g., the output linewidth of the secondary laser is reduced to be equal to the linewidth of the input seed laser. In another example, the primary laser is monolithically integrated as a mutually injected reference oscillator and seed laser with the secondary laser as a laser array block with individual DC controls. Additionally, direct current (DC)-control of phase and the optical loss may be further integrated to minimize optical feedback to the seed laser. By providing power monitor and phase elements in each splitter arm of the coupler stages to achieve destructive interference, an isolator is not required. Optimal destructive interference is achieved by controlling the phase difference and monitoring the power of individual lasers to minimize the aggregated power on an arm of the coupler of the first splitter stage that receives light from the seed laser.

Further consistent with an aspect of the present disclosure, a high-power low-noise laser or optical source structure is provided in which the following devices are integrated on a common substrate: DBR lasers (reference oscillator, seed laser and secondary laser array); a primary laser as a mutual injection locked scheme (if provided) including a low-noise (RIN and narrow linewidth) reference oscillator and seed lasers; an array of secondary lasers; coherent combine controls including power monitor and phase control elements (DC-control phase shifters and photodetectors); and DC-controls and optical loss elements to eliminate the need for external optical isolation between seed and primary lasers.

The architecture described herein provides DC-controls for sensing and phase control to ensure coherent combining of the amplitude and phase of the laser array outputs. Monolithic integration affords independent control of laser wavelength, power and phase on a per laser element basis to thereby facilitate coherent beam combining with independent sources. Once injection locking is achieved, laser power propagating towards the output from the laser array can be accurately controlled for optimal constructive interference, on a pair-by-pair basis. Similarly, seed laser power propagating towards the laser array can be accurately controlled for optimal destructive interference, on a pair-by-pair basis. Preferably optical taps and power monitors for each pair of lasers in the array, and at each MMI combining node. Optimal constructive/destructive interference is achieved by controlling the phase difference between the individual lasers and ensuring that the individual laser powers are identical. This is achieved by small corrections in laser bias current, followed by adjustment of the phase.

Stable operation, as a parameter for stable injection lock can be satisfied experimentally: 1) the input detuning, i.e. the frequency difference between the input seed laser and the free-running secondary lasers in the array, 2) locking range of the secondary laser, i.e., the maximum range of detuning that can be tolerated while still achieving injection locking, and 3) injection power.

As disclosed herein, a mutual injection locked oscillator is provided as a seed laser and subsequently injection locked to a coherent beam combiner using monolithically integrated components. Integrated optical couplers, phase shifters and photodetectors are used to optimize the output power of the beam by maximizing the constructive interference of light beams. This allows for scaling of the number of sources that can be coherently combined from the secondary laser array using a small form-factor and increased stability of the system to environmental drifts.

Similarly, the use of integrated couplers, phase shifters and photodetectors can also be used to minimize the backwards propagating power from the array of secondary lasers to the seed laser to thereby act as an optical isolator. Thus, the destructive interference of the backward propagating light does not impact the amount of light from the seed lasers incident on the secondary lasers in the array. The destructive interference control signals applied to the phase shifters in the backwards propagating direction are independently controlled from the phase shifters used in the combiner stages to support constructive interference. This architecture enables the realization of unidirectional injection locking from the seed laser to the array of secondary lasers without the need of an optical isolator.

Consistent with an aspect of the present disclosure, an optical source architecture is provided that does not require mutual injection locking between the secondary lasers in the cavity. The optical source includes monolithically integrated seed and oscillator lasers with an integrated optical isolation scheme whereby backward reflected light is eliminated or reduced by destructive interference.

Reference will now be made in detail to the present exemplary embodiments of the present disclosure, examples of which are illustrated in the accompanying drawings. Wherever possible, the same reference numbers will be used throughout the drawings to refer to the same or like parts.

FIG. 1 illustrates an optical source 100 consistent with an aspect of the present disclosure. Optical source 100 includes sections 110, 112, 114, and 116. Section 110 includes a parent or seed laser, and section 112 includes optical splitting circuitry, as well as circuitry for reducing injection of light back to the seed laser. Laser array section 114 includes an array of lasers, each of which receiving a respective portion of the light output from the seed laser to thereby injection lock the lasers of the array with the seed laser. In section 116, the outputs of the laser array constructively interfere with one another to provide an output of optical source 100. Each of sections 110, 112, 114, and 116 are described in greater detail below. In one of example, the devices included in sections 110, 112, 114, and 116 are monolithically integrated and provided on substrate 102, which, in a further example, includes indium phosphide (InP) or another Group IIV semiconductor.

Figure 2:
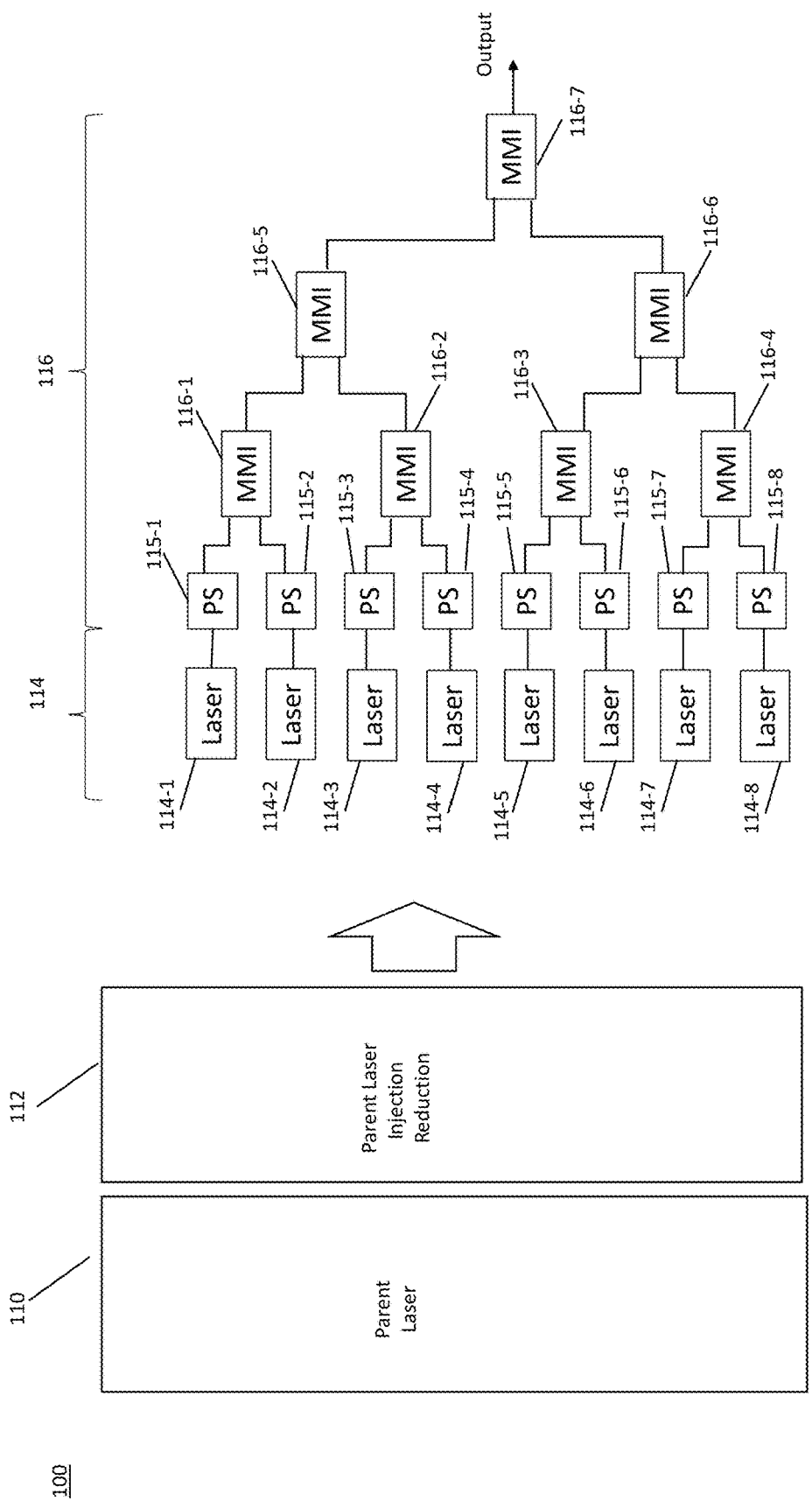
FIG. 2 illustrates a first portion of the optical source in greater detail.

FIG. 2 shows laser array (114) and combiner sections 116 in greater detail. Laser array 114 includes, for example, N lasers (N being an integer greater than or equal to 2), each of which may be, for example, a distributed Bragg reflector (DBR) laser. Other lasers may also be employed, such as distributed feedback (DFB) lasers. In the example shown in FIG. 2, N=8. It being understood, however, that any more or fewer lasers may be provided in laser array 114. The output of each laser 114 may be provided to section 116, which includes phase shifters 115 and couplers 116, which, in this example are multi-mode interference (MMI) couplers 116. It is understood, however, that other couplers, such as 1×N or N×N couplers may alternatively be provided.

As further shown in FIG. 2, the output of each laser 114 is supplied to a respective one of phase shifters 115-1 to 115-8, which may be provided to adjust the phase of the output of a corresponding one of lasers 114-1 to 114-8. Pairs of outputs of phase shifters 115 may be provided as inputs to a corresponding coupler of a first stage of combining couplers including couplers 116-1 to 116-4. Accordingly, for example, phase shifters 115-1 and 115-2 phase shift the outputs of lasers 114-1 and 114-2 and such phase shifted outputs are provided to coupler 116-1. Preferably, the phases of the outputs of lasers 114-1 and 114-2 are adjusted by phase shifters 115-1 and 115-2, such that such outputs constructively interfere with one another when combined by coupler 116-1. In a similar manner, the phase of outputs of lasers 114-3 and 114-4 is adjusted by phase shifters 115-3 and 115-4, such that the outputs constructively interfere with one another when combined by coupler 116-2. Further, the phase of outputs of lasers 114-5 and 114-6 is adjusted by phase shifters 115-5 and 115-6, such that the outputs constructively interfere with one another when combined by coupler 116-3. In addition, the phase of outputs of lasers 114-7 and 114-8 is adjusted by phase shifters 115-7 and 115-8, such that the outputs constructively interfere with one another when combined by coupler 116-4.

As further shown in FIG. 2, the outputs of MMI couplers 116-1 and 116-2 (including the combinations of the phase shifted outputs of lasers 114-1/114-2 and phase shifted outputs of lasers 114-3/114-4) are supplied to and combined by MMI coupler 116-5. In addition, the outputs of MMI couplers 116-3 and 116-4 (including the combinations of the phase shifted outputs of lasers 114-5/114-6 and phase shifted outputs of lasers 114-7/114-8) are supplied to and combined by MMI coupler 116-6. Couplers 116-5 and 116-6, in this example, constitute a second stage of combining couplers.

In a third and, in this example, final stage the outputs of couplers 116-5 and 116-6 are combined by coupler 116-7 to provide an optical source output, which includes the phase adjusted outputs of each of lasers 114-1 to 114-8.

Figure 3:
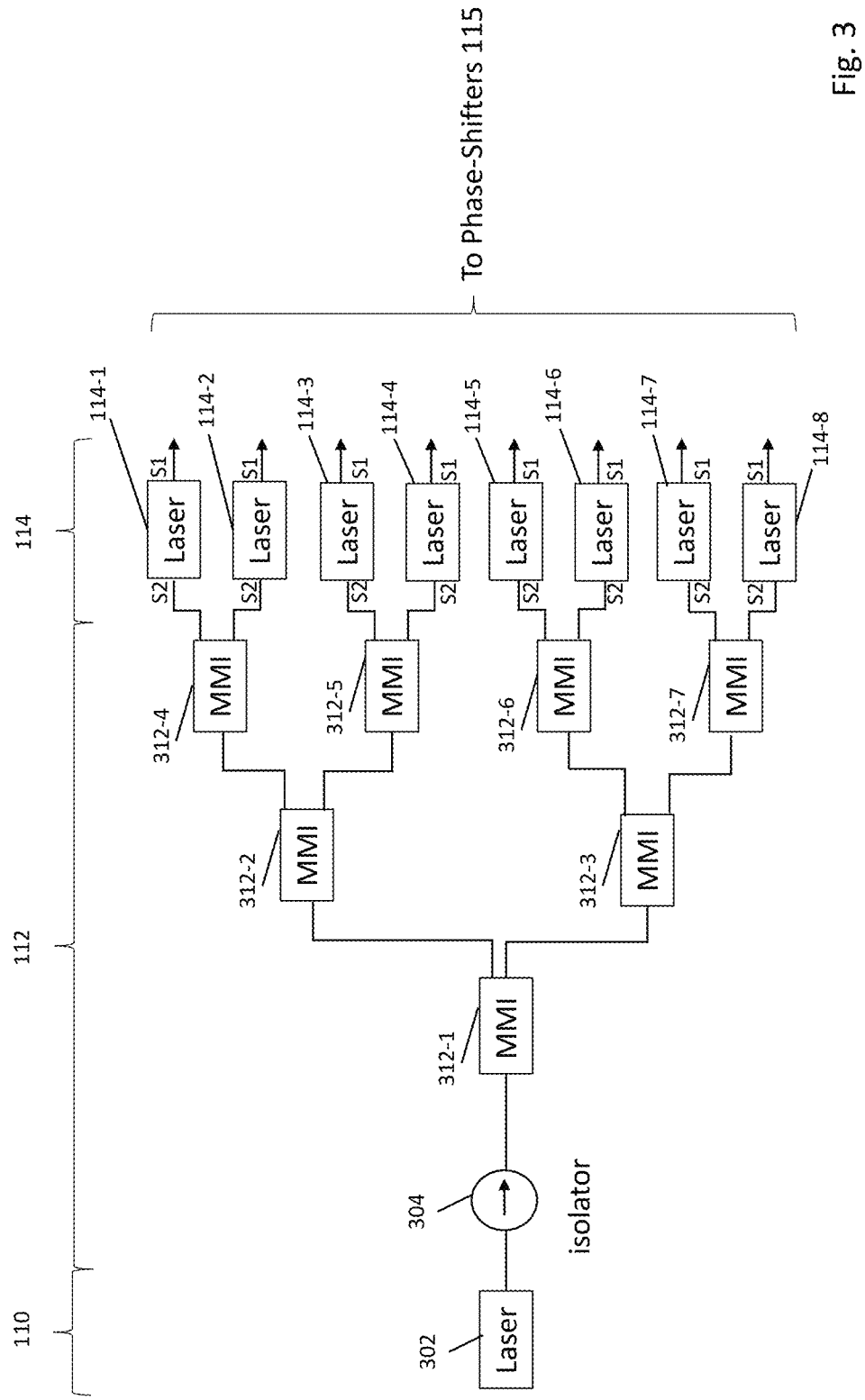
FIG. 3 illustrates an example of the second portion of the optical source.
Figure 4:
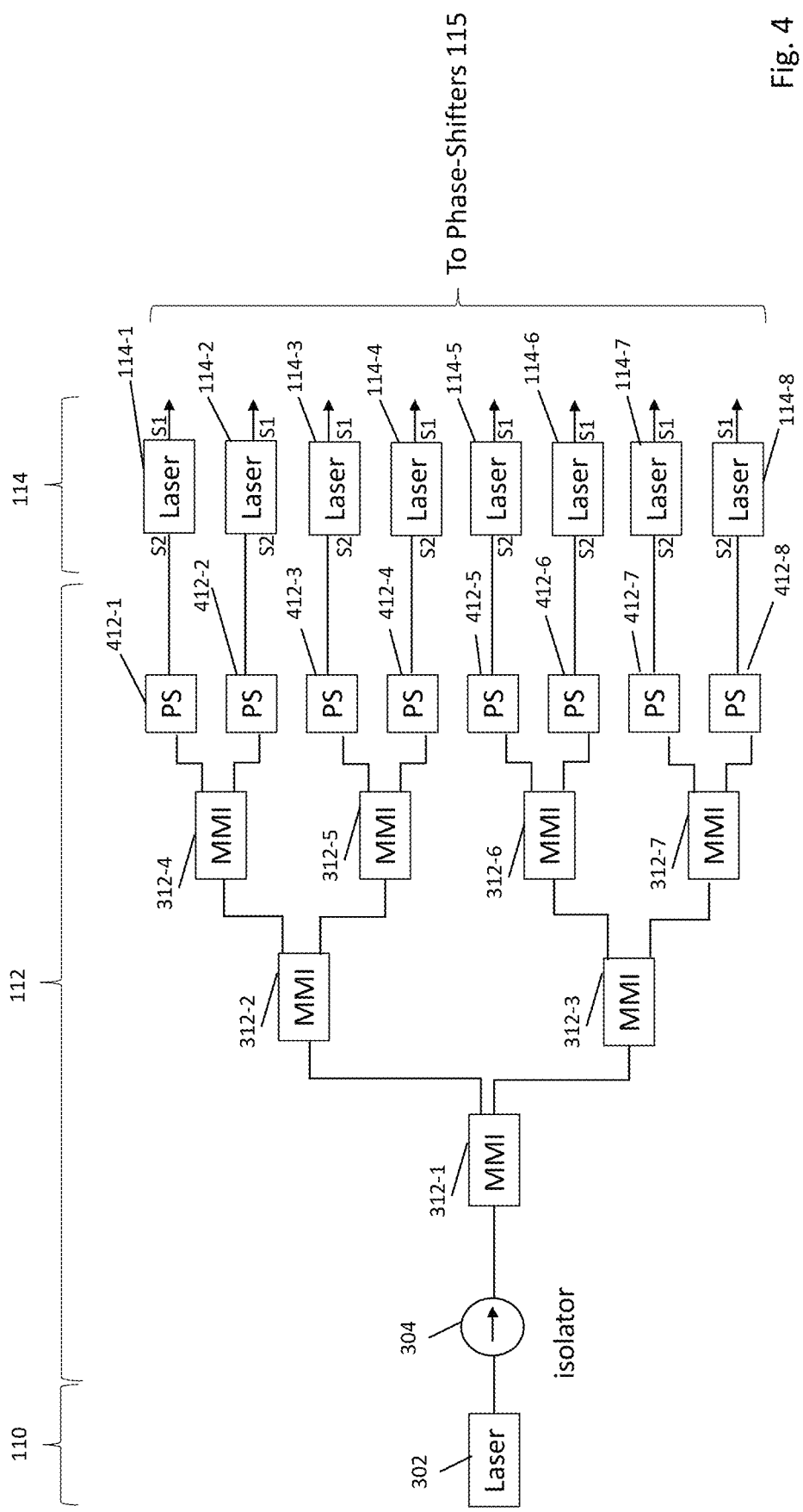
FIG. 4 illustrates a further example of the second portion of the optical source.

FIG. 3 shows an example of section 112 (split and parent laser injection reduction) in greater detail, as well as an example of a seed laser 302 providing an output to an isolator 304.

Seed laser 302 provides an optical output to isolator 304, which passes the optical signal to coupler 312-1. The optical signal is split, e.g. power split, by coupler 312-1, such that a first portion is provided to coupler 312-2 and a second portion of the optical signal is fed to coupler 312-3. Coupler 312-2 further splits the incoming signal portion into further signal portions supplied to couplers 312-4 and 312-5, respectively, and coupler 312-3 further splits the signal supplied thereto into further signal portions fed to corresponding couplers 312-6 and 312-7.

As further shown in FIG. 3, each of couplers 312-4, 312-5, 312-6, and 312-7 further splits the portions applied thereto and supplies such further split portions to a respective one of lasers 114. For example, coupler 312-4 supplies a first split portion of the input supplied thereto to laser 114-1 and a second split portion of the input supplied thereto to laser 114-2. In a similar manner, remaining couplers 312-5, 312-6, and 312-7 supply power split portions to pairs of lasers 114-3/114-4, 114-5/114-6, and 114-7/114-8. Thus, portions of the light output from laser 302 are fed to each of lasers 114 to thereby injection lock lasers 114 to laser 302. As a result, the outputs of lasers 114, as noted above are combined to provide an output that has significantly more optical power than laser 302 but, in one example, has the same frequency.

Although each of lasers 114 provides an output from side S1 from each laser to a respective one of phase shifters 115 (as part of combining section 116), light may also be output from side S2 of each laser 114 in a backward direction to laser 302. Although the output in the forward direction from side S1 of each laser 114 is significantly greater than the backward propagating light output from side S2, the backward propagating light can cause laser 302 to be unstable in that, for example, the frequency and/or the power of light output from laser 302 may fluctuate. Accordingly, in one example, isolator 304 may be provided to block such backward transmitted light from lasers 114 through couplers 312 to laser toward laser 302.

Isolator 304 may be difficult to integrate on substrate 102. Accordingly, consistent with a further aspect of the present disclosure, phase shifters 412-1 to 412-8 are provided, in one example, to adjust the phase of the outputs of the backward propagating light from lasers 114 to laser 302. Preferably, the phase of such light is adjusted or controlled such that when the backward propagating light is combined in couplers 312, for example, destructive interference occurs so that the backward propagating light is either reduced or eliminated.

For example, the phase of backward propagating light output from laser 114-1 may be shifted or adjusted by phase shifter 412-1, and the phase of backward propagating light output from laser 114-2 may be shifted or adjusted by phase shifter 412-2. The amount of phase adjustment imparted by phase shifters 412-1 and 412-2 may be sufficient so that a maximum amount of destructive interference occurs when the backward propagating light output from lasers 114-1 and 114-2 is combined in coupler 312-4.

In a similar manner, the phase of backward propagating light output from lasers 114-3 to 114-8 is adjusted by corresponding phase shifters 412-3 to 412-8 to provide maximum destructive interference in couplers 312-5 to 312-7. Accordingly, due to such destructive interference, the amount of backward propagating light reaching laser 308 is either eliminated or substantially reduced.

Figure 5:
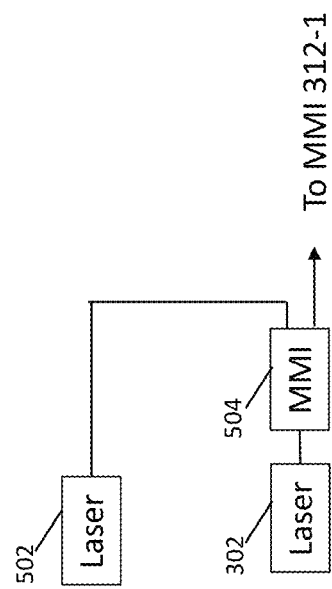
FIG. 5 illustrates an example of a laser configuration consistent with an aspect of the present disclosure.

FIG. 5 illustrates another example in which a reference laser 502 is provided that feeds light to seed laser 302. Preferably, reference laser 502 has a narrow linewidth and laser 302, in this example, has a broader linewidth but higher output power. When mutual injection locking occurs when reference laser provides light via coupler 504 to laser 302, the combined interaction between both lasers generates laser oscillation with a linewidth that is narrower than the linewidth of both lasers 302 and 502. As a result, spectrally pure, narrow linewidth output may be provided to coupler 312-1 and thus to lasers 114.

Figure 6:
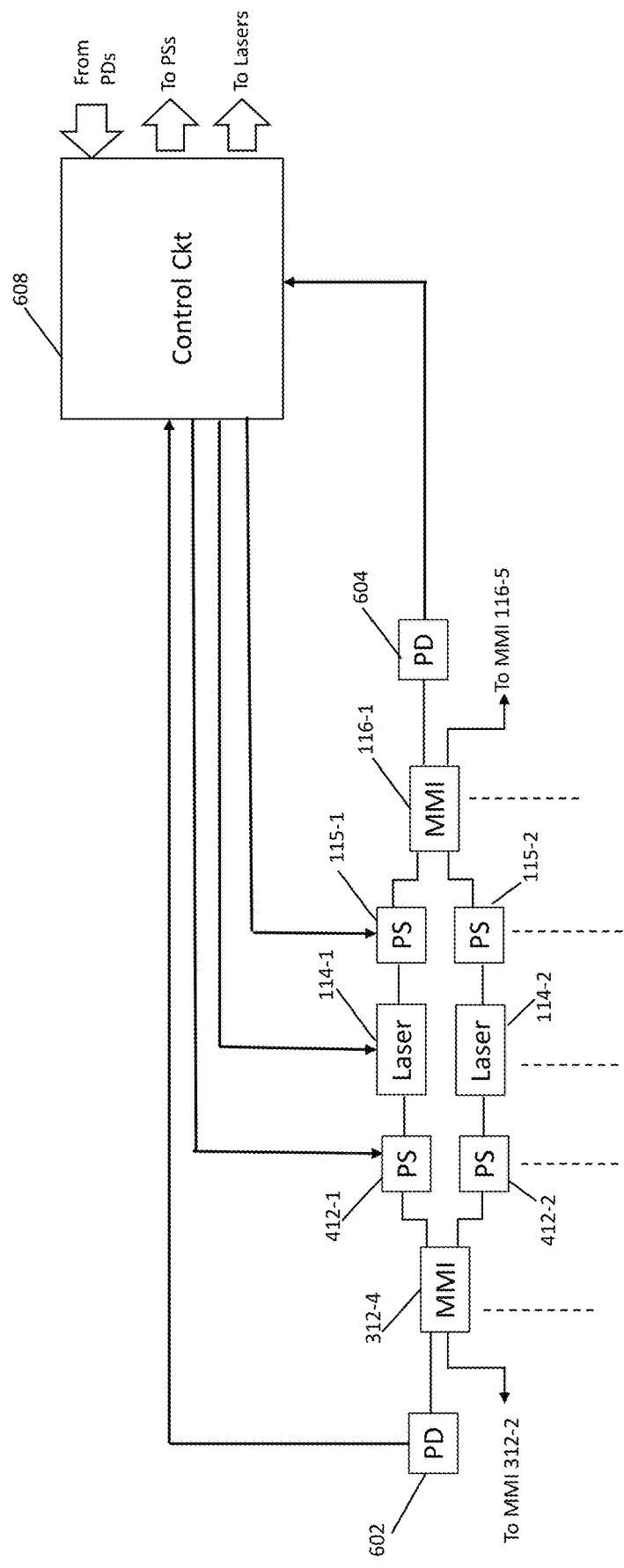
FIG. 6 illustrates an example of feedback control of phase and optical power consistent with a further aspect of the present disclosure.

FIG. 6 shows and example of circuitry that may be employed to control the power and phase of light output from lasers 114 to be combined at the output of optical source 100, as well as backward propagating light to laser 302. In the forward direction, i.e. in a propagation direction through section 116 to the optical source output, light output from phase shifters 115-1 and 115-2 is combined in coupler 116-1, as noted above. Coupler 116-1 has a first port that supplies most of the combined light to coupler 116-5. A small amount of such combined light is provided to photodetector or photodiode 604, which converts to the received combined light to an electrical signal. The electrical signal is, in turn, provided to a control circuit 608, which may include a microprocessor, for example, that includes analog-to-digital conversion circuitry to convert the received electrical signal to a digital signal. Based on the output of 604 photodiode, an appropriate control signal or voltage may be output by control circuit 608 to phase shifter 115-1, which, in response to such control signal, adjusts the phase of light output from laser 114-1. As noted above, such phase adjustment results in maximum constructive interference of light coupler 116-1.

In a further example, in the event that photodiode 604 outputs an electrical signal indicative of a relatively low amount of power received by photodiode 604, control circuit provides a control signal to phase shifter 115-1 to adjust the phase of light output from laser 114-1 so that such light constructively interferes with light from phase shifter 115-2 in coupler 116-1. Due to such constructive interference, the output power of coupler 116-1 increases. Photodiode 604 continues to monitor an output of coupler 116-1 so that the detected power is maintained at a maximum value and thus constructive interference, as well as the output power of optical source 100, are maintained at a maximum amount.

In another example, based on the output of photodiode 604, a further control signal may be provided to laser 114-1 to adjust the current supplied to, and thus the output power from, laser 114-1.

In the backward direction, photodiode 602 monitors the output power of light output from an additional port of coupler 312-4. Such port supplies a small amount of optical power while most power output from coupler 312-4 is provided fed to coupler 312-2. Photodiode 602 supplies an electrical signal to control circuit 608, which, in a manner similar to that described above provides an additional control signal based on such output from photodiode 602. In this example, the additional control signal is supplied to phase shifter 412-1 so as to facilitate destructive interference in coupler 312-4 between the backward propagating light originating from laser 114-1 and that originating from laser 114-2.

Accordingly, for example, if photodiode 602 outputs an electrical signal indicative of a relatively high output power and thus a large amount of undesirable backward propagating light, control circuit 608 may output a control signal to phase shifter 412-1 to adjust the phase thereof to increase the amount of destructive interference occurring in coupler 312-4. As a result, the amount of light supplied to photodiode 602 will decrease. Photodiode 602 continues to monitor an output of coupler 312-4 so that the detected power is maintained at a minimum value and thus destructive interference, as well as the output power of optical source 100, are maintained at a maximum amount.

Consistent with a further aspect of the present disclosure, photodiodes may be similarly coupled to one or more of couplers 312 and 116 to provide monitor electrical signals to control circuit 608. In a manner similar to that described above, such monitor electrical signals may be supplied to one or more of phase shifters 115 to maximize the power output from optical source 100 and well as reduce or eliminate the backward propagating light to laser 302. The current supplied to lasers 114 may also be controlled in a manner similar to that described above based on the monitor electrical signals.

In one implementation, the forward direction output power of each of lasers 114 may be 125 mW, such that, when combined in a manner similar to that described above, the output power of optical source 100 is about 1 W. On the other hand, the backward propagating light supplied from each laser 114 may be about 10 mW. However due to the techniques described above for blocking or generating destructive interference of the backward propagating light, the amount of backward propagating light may be eliminated or, in one example, reduced to 1 mW. In that case, the amount of backward propagating light associated with each laser 114 is less than 100 micro Watts.

Figure 7:
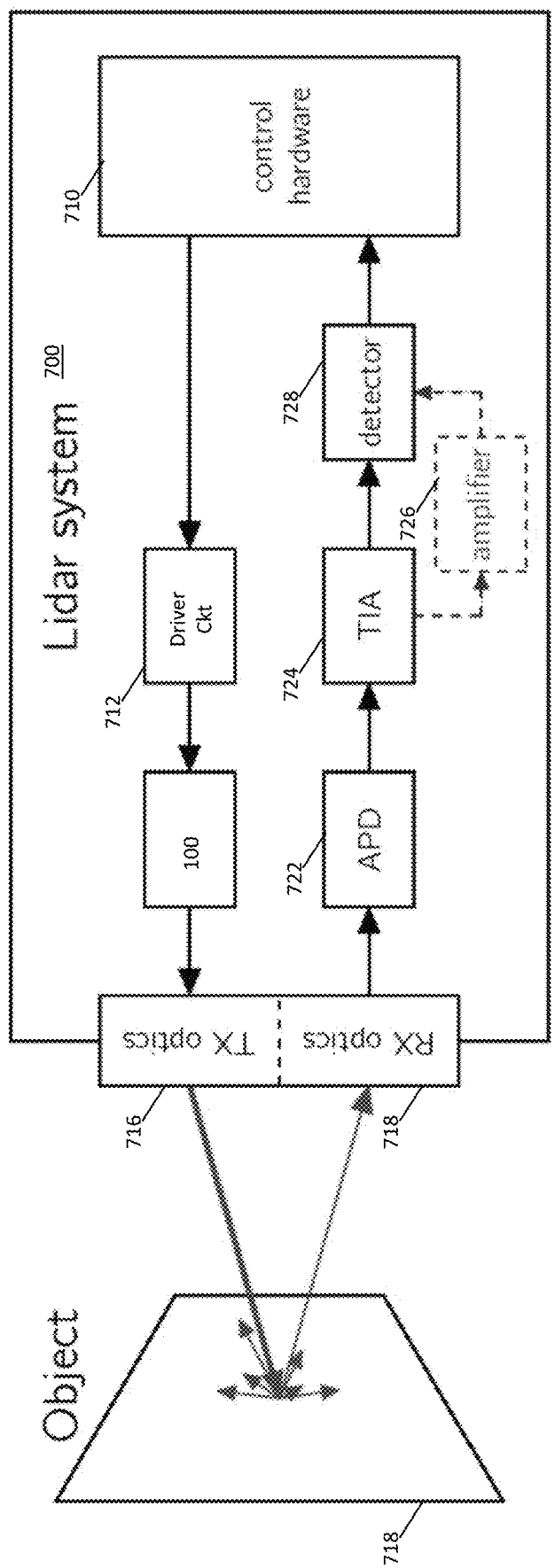
FIG. 7 shows an example of a Lidar system including an optical source consistent with the present disclosure.

FIG. 7 illustrates an example in which laser source 100 may be provided in a Light Detection and Ranging (Lidar) system 700. Here, control hardware 710 may provide a signal to driver circuit 712, which, in turn, activates or powers optical source 100 to generate an optical output, as described above. The optical signal is directed toward object 718 by, for example, a lens included in transmitter optics 716. Light reflected off object 718 is received by a lens, for example, included in receiver optics 720 and provided to a photodetector, such as avalanche photodiode (APD) 722. In response to the reflected light, APD 722 outputs a corresponding electrical signal to a transimpedance amplifier (TIA) 724 which provides an amplified signal to detector 728. An output of detector 728 is provided to control hardware 710, which may generate an image of object 718 or otherwise provide information related to the distance object 718 is from Lidar system 700, for example. As further shown in FIG. 7, an amplifier may be optionally provided to receive an output from transimpedance amplifier 724 and provide an amplified output to detector 728.

Figure 8:
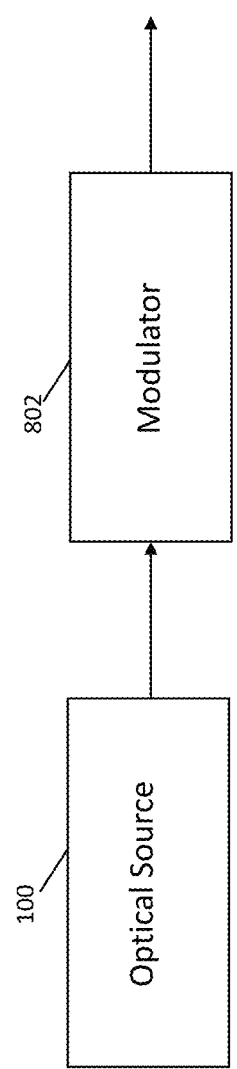
FIG. 8 shows an example of an optical source supplying an output to an optical modulator.

FIG. 8 shows another example in which optical source 100 provides light, such as continuous wave (CW) light to modulator 802, such as a Mach-Zehnder modulator or other optical modulator, such as an electro-absorption modulator.

FIG. 9 shows an example in which lens 902 is provided to collimate light received from modulator 802. The collimated light is then provided to a movable mirror, for example, which is operable to reflect the collimated light in a desired direction to a receiver. In one example, the components shown in FIGS. 8 and 9 may be provided in a free space optical system provided either in a terrestrial environment or in space.

FIG. 10 is a simplified view of an example of a phase shifter, such as one of phase shifters 115. Phase shifter 412 may have a similar construction. As shown in FIG. 10, phase shifter 115 may include a waveguide 1004 and an electrode 1002 disposed on a portion of a length of the waveguide. In one example, waveguide 1004 is provided on substrate 102. Upon application of a control signal described above, which may include a DC or slow varying bias or voltage, the phase of light propagating in waveguide 1004 may shift or change. In one example, the amount of phase shift is based on or in accordance with the voltage or bias applied to electrode 1002.

Other embodiments will be apparent to those skilled in the art from consideration of the specification. For example, more or fewer lasers, phase shifters, and couplers than the number of such components described above may be provided consistent with the present disclosure. In addition, different lasers, phase shifters, and couplers than that described above may be provided consistent with a further aspect of the present disclosure.

It is intended that the specification and examples be considered as exemplary only, with a true scope and spirit of the invention being indicated by the following claims.

What is claimed is:

1. An optical source, comprising:
    a first laser having a first side and a second side, the first laser being operable to supply a first optical signal from the first side and a second optical signal from the second side;
    a second laser having a first side and a second side, the second laser being operable to supply a third optical signal from the first side of the second laser, and the second laser being operable to supply a fourth optical signal from the second side of the second laser, power levels associated with the first and third optical signals being greater than power levels associated with the second and fourth optical signals;
    a first phase shifter operable to receive and adjust a phase of the second optical signal;
    a second phase shifter operable to receive and adjust a phase of the fourth optical signal;
    a coupler operable to receive the second phase adjusted optical signal and the fourth phase adjusted optical signal, whereby the second phase adjusted optical signal and the fourth phase adjusted optical signal combine with destructive interference in the optical coupler.

2. An optical source in accordance with claim 1, wherein the coupler is a first coupler, the optical source further including: a third laser having a first side and a second side, the third laser being operable to supply a fifth optical signal from the first side of the third laser and a sixth optical signal from the second side of the third laser; a fourth laser having a first side and a second side, the fourth laser being operable to supply a seventh optical signal from the first side of the second laser, and the fourth laser being operable to supply an eight optical signal from the second side of the fourth laser, power levels associated with the fifth and seventh optical signals being greater than power levels associated with the sixth and eighth optical signals; a third phase shifter operable to receive and adjust a phase of the sixth optical signal; a fourth phase shifter operable to receive and adjust a phase of the eighth optical signal; a second coupler operable to receive the sixth phase adjust optical signal and the eighth phase adjusted optical signal, whereby the sixth and eighth phase adjusted optical 1 signals combine with destructive interference in the second optical coupler; and a third optical coupler coupled to the first and second optical couplers.

3. An optical source in accordance with claim 1, wherein the third laser is a distrusted Bragg reflector (DBR) laser.

4. An optical source in accordance with claim 1, further including a third laser, a first portion of light output from the third laser being supplied to the first laser and a second portion of light output from the third laser being supplied to the second laser.

5. An optical source in accordance with claim 4, wherein the coupler is a first coupler, the optical source further including:
    a fourth laser; and
    a third coupler that receives an optical output from the fourth laser and directs the optical output of the fourth laser to the third laser.

6. An optical source in accordance with claim 1, wherein the optical coupler includes a multi-mode interference (MMI) coupler.

7. An optical source in accordance with claim 1, further including a photodiode coupled to the optical coupler, the optical coupler providing a third optical signal to the photodiode, the third optical signal indicative of a power level of light output from the optical coupler.

8. An apparatus, comprising:
    a first laser having a first side and a second side, the first laser being operable to output a first optical signal from the first side and a second optical signal from the second side;
    a second laser having a first side and a second side, the second laser being operable to supply a third optical signal from the first side of the second laser, and the second laser being operable to supply a fourth optical signal from the second side of the second laser, power levels associated with the first and third optical signals being greater than power levels associated with the second and fourth optical signals;
    a first phase shifter operable to receive and adjust a phase of the first optical signal;
    a second phase shifter operable to receive and adjust a phase of the second optical signal;
    a third phase shifter operable to receive and adjust a phase of the third optical signal;
    a fourth phase shifter operable to receive and adjust a phase of the fourth optical signal;
    a first coupler operable to receive the first phase adjusted signal and the third phase adjusted optical signal, whereby the first and second phase adjusted optical signals combine with constructive interference in the optical coupler to provide a combined optical output; and
    a second coupler operable to receive the second phase adjusted optical signal and the fourth phase adjusted optical signal, whereby the second phase adjusted optical signal and the fourth phase adjusted optical signal combine with destructive interference in the second optical coupler.

9. An apparatus in accordance with claim 8, wherein the each of the first and second couplers include a multimode interference (MMI) coupler.

10. An apparatus in accordance with claim 8, further including a third laser providing an optical output, the optical output of the third laser being split, such that a first portion of the optical output is of the third laser is fed to the first laser and a second portion of the optical output of the third laser is fed to the second laser.

11. An apparatus in accordance with claim 10, wherein the third laser is a distrusted Bragg reflector (DBR) laser.

12. An apparatus in accordance with claim 10, further including:
- a fourth laser; and
- a third coupler that receives an optical output from the fourth laser and directs the optical output of the fourth laser to the third laser.

13. An apparatus in accordance with claim 8, wherein each of the first optical coupler and the second optical coupler includes a multi-mode interference (MMI) coupler.

14. An apparatus in accordance with claim 8, further including:
- a first photodiode coupled to the first optical coupler, the first optical coupler providing a fifth optical signal to the first photodiode, the fifth optical signal being indicative of a power level of the combined optical output; and
- a second photodiode coupled to the second optical coupler, the second optical coupler providing a sixth optical signal to the second photodiode, the sixth optical signal being indicative of a power level of light output from the optical coupler.

15. An apparatus in accordance with claim 8, further including a control circuit, wherein, based on a first output provided by the first photodiode, the control circuit provides a first control signal to the first phase shifter, and, based on a second output provided by the second photodiode, the control circuit provides a second control signal to the second phase shifter.

* * * * *